United States Patent
Yim et al.

(10) Patent No.: US 7,422,776 B2
(45) Date of Patent: *Sep. 9, 2008

(54) LOW TEMPERATURE PROCESS TO PRODUCE LOW-K DIELECTRICS WITH LOW STRESS BY PLASMA-ENHANCED CHEMICAL VAPOR DEPOSITION (PECVD)

(75) Inventors: Kang Sub Yim, Santa Clara, CA (US); Lihua Li Huang, San Jose, CA (US); Francimar Schmitt, Santa Clara, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 214 days.

This patent is subject to a terminal disclaimer.

(21) Appl. No.: 11/149,826

(22) Filed: Jun. 10, 2005

(65) Prior Publication Data

US 2006/0043591 A1    Mar. 2, 2006

Related U.S. Application Data

(60) Provisional application No. 60/604,316, filed on Aug. 24, 2004.

(51) Int. Cl.
*H05H 1/24* (2006.01)
(52) U.S. Cl. .................. 427/577; 427/578; 427/579; 427/551
(58) Field of Classification Search ............ 427/569, 427/577, 578, 579, 551
See application file for complete search history.

(56) References Cited

U.S. PATENT DOCUMENTS

| | | | |
|---|---|---|---|
| 5,003,128 A | 3/1991 | Grondin | |
| 5,362,526 A | 11/1994 | Wang et al. | |
| 5,468,595 A | 11/1995 | Livesay | |
| 6,042,994 A | 3/2000 | Yang et al. | |
| 6,132,814 A | 10/2000 | Livesay et al. | |
| 6,150,070 A | 11/2000 | Minter et al. | |
| 6,177,143 B1 | 1/2001 | Treadwell et al. | |

(Continued)

FOREIGN PATENT DOCUMENTS

EP        1 119 035 A        7/2001

(Continued)

OTHER PUBLICATIONS

Demos et al., "A Thermally Stable, k<2.5 Carbon-Doped Oxide Film Deposited by a Plasma-Enhance CVD Process," Microsoft Power Point presentation, Applied Materials, Santa Clara, CA, USA, May 11, 2004, 21 pages total.

(Continued)

*Primary Examiner*—Bret Chen
(74) *Attorney, Agent, or Firm*—Townsend and Townsend and Crew

(57) ABSTRACT

Low K dielectric films exhibiting low mechanical stress may be formed utilizing various techniques in accordance with the present invention. In one embodiment, carbon-containing silicon oxide films are formed by plasma-assisted chemical vapor deposition at low temperatures (300° C. or less). In accordance with another embodiment, as-deposited carbon containing silicon oxide films incorporate a porogen whose subsequent liberation reduces film stress.

7 Claims, 11 Drawing Sheets

U.S. PATENT DOCUMENTS

| | | | |
|---|---|---|---|
| 6,195,246 B1 | 2/2001 | Livesay et al. | |
| 6,204,201 B1 | 3/2001 | Ross | |
| 6,207,555 B1 | 3/2001 | Ross | |
| 6,218,090 B1 | 4/2001 | Minter et al. | |
| 6,255,035 B1 | 7/2001 | Minter et al. | |
| 6,271,146 B1 | 8/2001 | Ross | |
| 6,319,655 B1 | 11/2001 | Wong et al. | |
| 6,340,556 B1 | 1/2002 | Wong | |
| 6,358,670 B1 | 3/2002 | Wong et al. | |
| 6,407,399 B1 | 6/2002 | Livesay | |
| 6,410,462 B1 * | 6/2002 | Yang et al. | 438/788 |
| 6,426,127 B1 | 7/2002 | Ross et al. | |
| 6,465,372 B1 * | 10/2002 | Xia et al. | 438/787 |
| 6,489,225 B1 | 12/2002 | Ross et al. | |
| 6,511,923 B1 * | 1/2003 | Wang et al. | 438/783 |
| 6,541,367 B1 | 4/2003 | Mandal | |
| 6,548,899 B2 | 4/2003 | Ross | |
| 6,551,926 B1 | 4/2003 | Ross | |
| 6,582,777 B1 | 6/2003 | Ross et al. | |
| 6,596,627 B2 | 7/2003 | Mandal | |
| 6,607,991 B1 | 8/2003 | Livesay et al. | |
| 6,632,478 B2 * | 10/2003 | Gaillard et al. | 427/255.37 |
| 6,635,575 B1 | 10/2003 | Xia et al. | |
| 6,663,973 B1 | 12/2003 | Lee et al. | |
| 6,797,643 B2 * | 9/2004 | Rocha-Alvarez et al. | 438/758 |
| 6,806,203 B2 * | 10/2004 | Weidman et al. | 438/736 |
| 6,914,014 B2 * | 7/2005 | Li et al. | 438/781 |
| 7,056,560 B2 * | 6/2006 | Yim et al. | 427/551 |
| 7,094,713 B1 * | 8/2006 | Niu et al. | 438/795 |
| 7,135,402 B2 * | 11/2006 | Lin et al. | 438/639 |
| 7,166,531 B1 * | 1/2007 | van den Hoek et al. | 438/623 |
| 7,208,389 B1 * | 4/2007 | Tipton et al. | 438/409 |
| 2003/0143865 A1 | 7/2003 | Grill et al. | |
| 2004/0082199 A1 | 4/2004 | Cheung et al. | |
| 2005/0042884 A1 | 2/2005 | Hyodo et al. | |

FOREIGN PATENT DOCUMENTS

| | | |
|---|---|---|
| EP | 1 420 439 A2 | 5/2004 |
| WO | WO 99/41423 A2 | 8/1999 |
| WO | WO 01/61737 A1 | 8/2001 |
| WO | WO 2004/111296 A | 12/2004 |

OTHER PUBLICATIONS

Dixit et al., "Film Properties and Integration Performance of a Nano-Porous Carbon Doped Oxide," Microsoft Power Point presentation, Applied Materials, Santa Clara, CA, USA, May 11, 2004, 22 pages total.

* cited by examiner

LOW TEMPERATURE PROCESS TO PRODUCE LOW-K DIELECTRICS WITH LOW STRESS BY PLASMA-ENHANCED CHEMICAL VAPOR DEPOSITION (PECVD)

CROSS-REFERENCE TO RELATED APPLICATION

This nonprovisional patent application claims priority to U.S. provisional patent application No. 60/604,316, filed Aug. 24, 2004, which is incorporated by reference herein for all purposes.

BACKGROUND OF THE INVENTION

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. A preferred method of depositing metal and dielectric films at relatively low temperatures is plasma-enhanced CVD (PECVD) techniques such as described in U.S. Pat. No. 5,362,526, entitled "Plasma-Enhanced CVD Process Using TEOS for Depositing Silicon Oxide", which is incorporated by reference herein. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 µm and even 0.25 µm feature sizes, and tomorrow's plants soon will be producing devices having even smaller geometries.

In order to further reduce the size of devices on integrated circuits, it has become necessary to use conductive materials having low resistivity and insulators having low k (dielectric constant <2.5) to reduce the capacitive coupling between adjacent metal lines. Liner/barrier layers have been used between the conductive materials and the insulators to prevent diffusion of byproducts such as moisture onto the conductive material as described in International Publication Number WO 99/41423, published on Aug. 17, 1999. For example, moisture that can be generated during formation of a low k insulator readily diffuses to the surface of the conductive metal and increases the resistivity of the conductive metal surface. A barrier/liner layer formed from organosilicon or organosilane nitride materials can block the diffusion of the byproducts. However, the barrier/liner layers typically have dielectric constants that are greater than about 2.5, and the high dielectric constants result in a combined insulator that may not significantly reduce the dielectric constant.

FIG. 1A-1E illustrates a three-layer deposition PECVD process for depositing a PECVD lining layer 2 of the oxidized organosilane or organosiloxane polymer as described in International Publication Number WO 99/41423. The lining layer 2 acts as an isolation layer between a subsequent layer 7 and the underlying substrate surface 6 and metal lines 8, 9, 10 formed on the substrate surface. The layer 7 is capped by a PECVD capping layer 12 of the oxidized organosilane or organosiloxane polymer. The PECVD process deposits a multi-component dielectric layer, wherein a carbon containing silicon dioxide ($SiO_2$) is first deposited on the patterned metal layer having metal lines 8, 9, 10 formed on substrate 6.

Referring to FIG. 1A, the PECVD lining layer 2 is deposited by the plasma enhanced reaction of an organosilane or organosiloxane compound such as methylsilane, $CH_3SiH_3$, and an oxidizing gas such as $N_2O$ in the presence of an inert gas, such as argon, at a temperature of between about 50-350° C. The oxidized organosilane or organosiloxane layer is then cured. The deposited PECVD lining layer 2 (at about 2000 Å per minute) has improved barrier characteristics for the subsequent deposition of the layer 7 shown in FIG. 1B. The lining layer obtained from methylsilane has sufficient C—H bonds to be hydrophobic, and is an excellent moisture barrier. A low K dielectric layer 7 is then deposited on the liner layer 2 by the reaction of a silane compound and hydrogen peroxide ($H_2O_2$) at a temperature below 200° C. at a pressure of about 0.2 to about 5 Torr during deposition of the layer 7. The layer 7 may be partially cured as shown in FIG. 1C to remove solvents such as water prior to deposition of a cap layer 12 as shown in FIG. 1D. Curing is performed by pumping down a reaction under an inert gas atmosphere under 10 Torr.

Conventional liner layers, such as silicon nitride (SiN), have higher dielectric constants than silicon oxides, and the combination of low k dielectric layers with high k dielectric liner layers provides little or no improvement in the overall stack dielectric constant and capacitive coupling. Referring to FIG. 1D, after deposition of the layer 7, an optional capping layer 12 may be deposited on the low k dielectric layer 7 by the plasma enhanced reaction of an organosilane or organosiloxane compound and an oxidizing gas such as $N_2O$. Referring to FIG. 1E, after deposition of the capping layer, if any, the deposited layers are cured in a furnace or another chamber to drive off remaining solvent or water. The capping layer 12 is also an oxidized organosilane or organosiloxane film that has good barrier properties and has a dielectric constant of about 4.0. Both the liner layer 2 and the cap layer 12 have a dielectric constant greater than 3.0 and the high dielectric constant layers substantially detract from the benefit of low k dielectric layer 7.

As devices get smaller, liner layers and cap layers having relatively high dielectric constants contribute more to the overall dielectric constant of a multi-component dielectric layer. Additionally, the smaller device geometries result in an increase in parasitic capacitance between devices. Parasitic capacitance between metal interconnects on the same or adjacent layers in the circuit can result in crosstalk between the metal lines or interconnects and/or resistance-capacitance (RC) delay, thereby reducing the response time of the device and degrading the overall performance of the device. The effects of parasitic capacitance between metal interconnects on the same or adjacent layers in the circuit is especially of concern as the current state of the art circuits can employ 4 to 5 levels of interconnection, while next generation devices may require 6, 7, or possibly 8 levels of interconnection.

Lowering the parasitic capacitance between metal interconnects separated by dielectric material can be accomplished by either increasing the thickness of the dielectric material or by lowering the dielectric constant of the dielectric material. Increasing the thickness of the dielectric materials, however, does not address parasitic capacitance within the same metallized layer or plane. As a result, to reduce the parasitic capacitance between metal interconnects on the same or adjacent layers, one must change the material used between the metal lines or interconnects to a material having a lower dielectric constant than that of the materials currently used, i.e., k≈3.0.

Therefore, there remains a need for dielectric layers having dielectric constants below about 2.5 with good adhesion properties.

BRIEF SUMMARY OF THE INVENTION

Low K dielectric films exhibiting a low tensile stress of less than about 20 MPa may be formed utilizing various techniques in accordance with the present invention. In one embodiment, carbon-containing silicon oxide films are formed by plasma-assisted chemical vapor deposition at low temperatures (300° C. or less). In accordance with another embodiment, as-deposited carbon containing silicon oxide films incorporate a porogen whose subsequent liberation reduces film stress.

An embodiment of a method in accordance with the present invention of depositing a carbon-doped silicon oxide film, comprises, mixing a silicon containing precursor with a carbon containing precursor in the presence of a plasma to deposit a carbon doped silicon oxide layer having a stress of about 20 MPa or less.

An embodiment of a dielectric film in accordance with the present invention, comprises, a carbon-doped silicon oxide film exhibiting a stress of 20 MPa or less.

An embodiment of an interconnect metallization structure in accordance with the present invention, comprises, a first metallization layer, and a carbon doped silicon oxide layer overlying the first metallization layer, the carbon doped silicon oxide layer exhibiting a stress of about 20 MPa or less. A second metallization layer overlies the carbon doped silicon oxide layer.

A further understanding of embodiments in accordance with the present invention can be made by way of reference to the ensuing detailed description taken in conjunction with the accompanying drawings.

DETAILED DESCRIPTION OF THE INVENTION

Figure 1A:
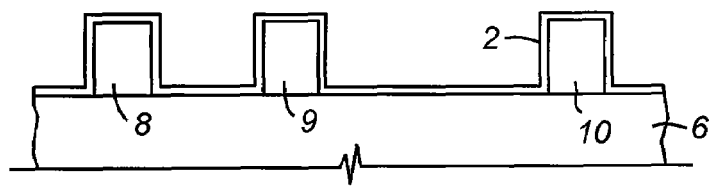
FIG. 1A-1E are schematic diagrams of dielectric layers deposited on a substrate by the processes known in the art.
Figure 1B:
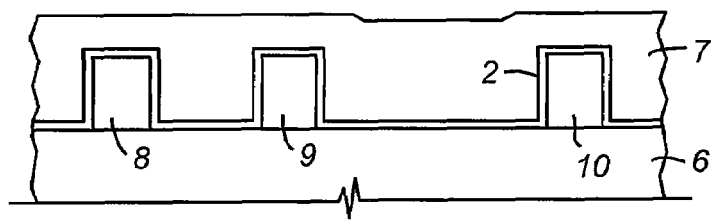
Figure 1C:
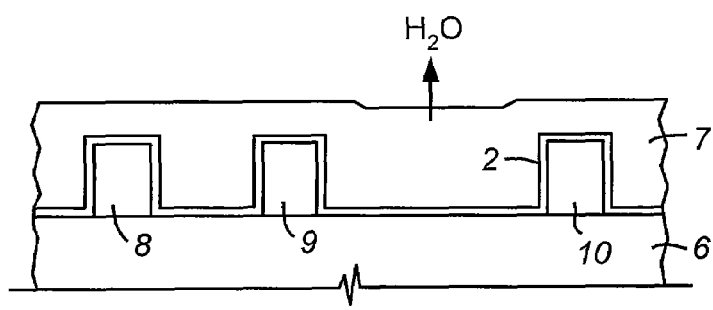
Figure 1D:
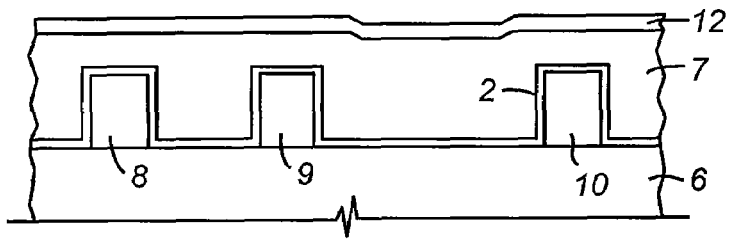
Figure 1E:
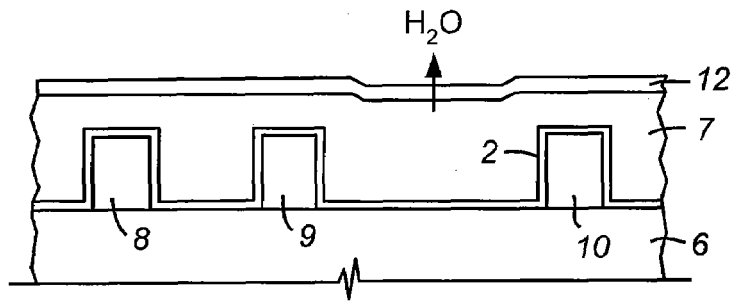

Incorporated by reference herein for all purposes are U.S. Pat. Nos. 6,541,367 and 6,596,627. These patents describe depositing a nano-porous silicon oxide layer having a low dielectric constant. The nano-porous silicon oxide layer is produced by plasma enhanced (PECVD) or microwave enhanced chemical vapor deposition of a silicon/oxygen containing material that optionally contains thermally labile organic groups, and by controlled annealing of the deposited silicon/oxygen containing material to form microscopic gas pockets that are uniformly dispersed in a silicon oxide layer. The relative volume of the microscopic gas pockets to the silicon oxide layer is controlled to preferably maintain a closed cell foam structure that provides low dielectric constants after annealing. The nano-porous silicon oxide layers will have dielectric constants less than about 3.0, preferably less than about 2.5.

The silicon/oxygen material is chemical vapor deposited by reacting an oxidizable silicon containing compound or mixture comprising an oxidizable silicon component and an unsaturated non-silicon bearing component having thermally labile groups with an oxidizing gas. The oxidizing gases include but are not limited to oxygen ($O_2$) or oxygen containing compounds such as nitrous oxide ($N_2O$), ozone ($O_3$), and carbon dioxide ($CO_2$), preferably $N_2O$ or $O_2$.

Oxygen and oxygen containing compounds are preferably dissociated to increase reactivity when necessary to achieve a desired carbon content in the deposited film. RF power can be coupled to the deposition chamber to increase dissociation of the oxidizing compounds. The oxidizing compounds may also be dissociated in a microwave chamber prior to entering the deposition chamber to reduce excessive dissociation of the silicon containing compounds. Deposition of the silicon oxide layer can be continuous or discontinuous. Although deposition preferably occurs in a single deposition chamber, the layer can be deposited sequentially in two or more deposition chambers. Furthermore, RF power can be cycled or pulsed to reduce heating of the substrate and promote greater porosity in the deposited film.

The oxidizable silicon component of the oxidizable silicon containing compound or mixture comprises organosilane or organosiloxane compounds which generally include the structure:

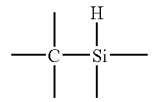

wherein each Si is bonded to at least one hydrogen atom and may be bonded to one or two carbon atoms, and C is included in an organo group, preferably alkyl or alkenyl groups such as —$CH_3$, —$CH_2$-$CH_3$, —$CH_2$—, or —$CH_2$-$CH_2$—, or fluorinated carbon derivatives thereof. When an organosilane or organosiloxane compound includes two or more Si atoms, each Si is separated from another Si by —O—, —C—, or —C—C—, wherein each bridging C is included in an organo group, preferably alkyl or alkenyl groups such as —$CH_2$—, —$CH_2$—$CH_2$—, —$CH(CH_3)$—, —$C(CH_3)_2$—, or fluorinated carbon derivatives thereof. The preferred organosilane and organosiloxane compounds are gases or liquids near room temperature and can be volatilized above about 10 Torr. Suitable silicon containing compounds include:

| | |
|---|---|
| methylsilane, | $CH_3$—$SiH_3$ |
| dimethylsilane, | $(CH_3)_2$—$SiH_2$ |
| disilanomethane, | $SiH_3$—$CH_2$—$SiH_3$ |
| bis(methylsilano)-methane, | $CH_3$—$SiH_2$—$CH_2$—$SiH_2$—$CH_3$ |
| 2,4,6-trisilaoxane | —(—$SiH_2$—$CH_2$—$SiH_2$—$CH_2$—$SiH_2$—O—)— (cyclic) |
| cyclo-1,3,5,7-tetrasilano-2,6-dioxy-4,8-dimethylene | —(—$SiH_2$—$CH_2$—$SiH_2$—O—)$_2$— (cyclic) |
| 1,3,5-trisilacyclohexane, | —(—$SiH_2$—$CH_2$—)$_3$— (cyclic) |
| 1,3-dimethyl-disiloxane, | $CH_3$—$SiH_2$—O—$SiH_2$—$CH_3$ |
| 1,1,3,3-tetramethyl-disiloxane | $(CH_3)_2$—SiH—O—SiH—$(CH_3)_2$ |
| 1,1,5,5-tetramethyl-trisiloxane, and | $(CH_3)_2$—SiH—O—$SiH_2$—O—SiH—$(CH_3)_2$ |
| 1,1,3,5,5-pentamethyl-trisiloxane | $(CH_3)_2$—SiH—O—SiH$(CH_3)$—O—SiH—$(CH_3)_2$ | and fluorinated carbon derivatives thereof, such as 1,2-disilanotetrafluoroethane. The hydrocarbon groups in the organosilanes and organosiloxane may be partially or fully fluorinated to convert C—H bonds to C—F bonds. Many of the preferred organosilane and organosiloxane compounds are commercially available. A combination of two or more of the organosilanes or organosiloxanes can be employed to provide a blend of desired properties such as dielectric constant, oxide content, hydrophobicity, film stress, and plasma etching characteristics.

When the oxidizable silicon component forms a compound with an unsaturated non-silicon bearing component having thermally labile groups, the organosilane or organosiloxane compound are functional groups possessing both a silicon oxygen bond and a silicon-hydrogen bond. Preferred functional groups having the bonding requirements include:

| | |
|---|---|
| methylsiloxy, and | ($CH_3$—$SiH_2$—O—) |
| dimethylsiloxy | (($CH_3)_2$—SiH—O—) |

The unsaturated non-silicon bearing component having thermally labile groups has the property of reacting with a plasma-sustained oxidizing environment to form thermally labile molecules that deposit, and which, when subsequently exposed to elevated temperatures, thermally decompose to form volatile species with low boiling points. Decomposition and evolution of the thermally labile group's volatile species from the deposited film will leave voids in the structure, reducing the structure's density. Selectively removing embedded chemically reacted solid material within the deposited film by a thermal process results in low density films which have low dielectric constants. Formation of voids using some compounds such as 2,4,6-trisilaoxane (2,4,6-trisilatetrahydropyran) and cyclo-1,3,5,7-tetrasilano-2,6-dioxy-4,8-dimethylene is achieved during annealing without addition of labile groups by virtue of a non-planar ring structure:

1,3,5,7-tetrasilano-2,6-dioxy-4,8-dimethylene, and —(—$SiH_2$—$CH_2$—$SiH_2$—O—)$_2$-(cyclic) 2,4,6-trisilatetrahydropyran, —$SiH_2$—$CH_2$—$SiH_2$—$CH_2$—$SiH_2$—O-(cyclic)

The thermally labile organic groups contain sufficient oxygen to form gaseous products when the silicon oxide layer is annealed.

When the oxidizable silicon component forms a compound with an unsaturated non-silicon bearing component having thermally labile groups, preferred thermally labile groups are non-silicon containing multiply unsaturated cycloalkanes (having two or more carbon-carbon double bonds), including heterocyclodialkenes, with oxygen or nitrogen incorporated within the molecular structure, and which generally tend to perform favorably in plasma environments. Preferred labile groups include:

| | |
|---|---|
| Dioxin, $C_4H_4O_2$, | —(—CH=CH—O—CH=CH—O—)—, cyclic |
| Furan, $C_4H_4O$, | —(—CH=CH—CH=CH—O—)—, cyclic |
| Fulvene, $C_6H_6$, | —(—CH=CH—CH=CH—C($CH_2$)—)—, cyclic |

Oxidizable silicon containing compounds comprising the oxidizable silicon component and the thermally labile groups include:

| | |
|---|---|
| methylsilyl-1,4-dioxinyl ether | $CH_3$—$SiH_2$—O—($C_4H_3O_2$) |
| 2-methylsiloxanyl furan | —(—CH=CH—CH=C(O—$SiH_2$—$CH_3$)—O—)—, cyclic |
| 3-methylsiloxanyl furan | —(—CH=CH—C(O—$SiH_2$—$CH_3$)=CH—O—)—, cyclic |
| 2,5-bis(methylsiloxy)-1,4-dioxin | —(—CH=C(O—$SiH_2$—$CH_3$)—O—CH=C(O—$SiH_2$—$CH_3$)—O—)—, cyclic |
| 3,4-bis(methylsiloxanyl) furan | —(—CH=C(O—$SiH_2$—$CH_3$)—C(O—$SiH_2$—$CH_3$)=CH—O—)—, cyclic |
| 2,3-bis(methylsiloxanyl) furan | —(—CH=CH—C(O—$SiH_2$—$CH_3$)=C(O—$SiH_2$—$CH_3$)—O—)—, cyclic |
| 2,4-bis(methylsiloxanyl) furan | —(—CH=C(O—$SiH_2$—$CH_3$)—CH=C(O—$SiH_2$—$CH_3$)—O—)—, cyclic |
| 2,5-bis(methylsiloxanyl) furan | —(—C(O—$SiH_2$—$CH_3$)=CH—CH=C(O—$SiH_2$—$CH_3$)—O—)—, cyclic |
| 1-methylsiloxanylfulvene | —(—CH=CH—CH=CH—C(CH(O—$SiH_2$—$CH_3$))—)—, cyclic |
| 2-methylsiloxanylfulvene | —(—CH=CH—CH=CH—C($CH_2$)(O—$SiH_2$—$CH_3$))—)—, cyclic |
| 6-methylsiloxanylfulvene | —(—C(O—$SiH_2$—$CH_3$)=CH—CH=CH—C=CH)—, cyclic |
| bis(methylsiloxanyl)fulvene | ($C_6H_4$)(O—$SiH_2$—$CH_3$)$_2$, cyclic |
| dimethylsilyl-1,4-dioxinyl ether | $(CH_3)_2$—SiH—O—($C_4H_3O_2$), cyclic |
| 2-dimethylsiloxanyl furan | —(—CH=CH—CH=C(O—SiH—$(CH_3)_2$)—O—)—, cyclic |
| 3-dimethylsiloxanyl furan | —(—CH=CH—C(O—SiH—$(CH_3)_2$)=CH—O—)—, cyclic |
| 2,5-bis(dimethylsiloxy)-1,4-dioxin | —(—CH=C(O—SiH—$(CH_3)_2$)—O—CH=C(O—SiH—$(CH_3)_2$)—O—)—, cyclic |
| 3,4-bis(dimethylsiloxanyl) furan | —(—CH=C(O—SiH—$(CH_3)_2$)—C(O—SiH—$(CH_3)_2$)=CH—O—)— cyclic |
| 2,3-bis(dimethylsiloxanyl) furan | —(—CH=CH—C(O—SiH—$(CH_3)_2$)=C(O—SiH—$(CH_3)_2$)—O—)— cyclic |
| 2,4-bis(dimethylsiloxanyl) furan | —(—CH=C(O—SiH—$(CH_3)_2$)—CH=C(O—SiH—$(CH_3)_2$)—O—)— cyclic |
| 2,5-bis(dimethylsiloxanyl) furan | —(—C(O—SiH—$(CH_3)_2$)=CH—CH=C(O—SiH—$(CH_3)_2$)—O—)— cyclic |
| 1-dimethylsiloxanylfulvene | —(—CH=CH—CH=CH—C(CH(O—SiH—$(CH_3)_2$))—)—, cyclic |
| 2-dimethylsiloxanylfulvene | —(—CH=CH—CH=CH—C($CH_2$)(O—SiH—$(CH_3)_2$))—)—, cyclic |
| 6-dimethylsiloxanylfulvene | —(—C(O—SiH—$(CH_3)_2$)=CH—CH=CH—C=CH)—, cyclic |
| bis(dimethylsiloxanyl)fulvene | ($C_6H_4$)(O—SiH—$(CH_3)_2$)$_2$, cyclic | and fluorinated carbon derivatives thereof. Preferably the compounds are liquid at room temperature and can be volatilized near a pressure of 10 Torr or above. Such compounds react with an oxidizing gas to form a gel-like silicon/oxygen containing material that retains many of the labile organic groups at temperatures below about 50° C.

The amount of labile organic groups retained in the deposited silicon/oxygen containing material can be increased by mixing the reactive compounds with non-silicon containing components that comprise one or more labile organic groups. The labile organic groups include the dioxan, furan, and fulvene derivative chemicals described for the silicon containing reactive compounds and other oxygen containing organic groups. The labile organic groups are preferably the silicon containing and non-silicon containing components incorporated in the same molecule, but with the methylsilyl or methylsiloxanyl groups replaced with vinyl groups, or with the methylsiloxanyl groups replaced with ester groups, or with the methylsiloxanyl groups replaced with other non-silicon containing organic groups, in addition to those chemicals without the methylsiloxanyl groups, such as 1,4-dioxin and furan. Preferred non-silicon containing multiply unsaturated cycloalkanes (having two or more carbon-carbon double bonds) include:

| | |
|---|---|
| vinyl-1,4-dioxinyl ether | $CH_2=CH_2-O-(C_4H_3O_2)$, cyclic |
| vinyl furyl ether | $CH_2=CH_2-O-(C_4H_3O)$, cyclic |
| vinyl-1,4-dioxin | $CH_2=CH_2-(C_4H_3O_2)$, cyclic |
| vinyl furan | $CH_2=CH_2-O-(C_4H_3O)$, cyclic |
| methyl furoate | $CH_3C(O)-O-(C_4H_3O)$, cyclic |
| furyl formate | $(C_4H_3O)-COOH$, cyclic |
| furyl acetate | $(C_4H_3O)-CH_2COOH$, cyclic |
| furaldehyde | $CH(O)-(C_4H_3O)$, cyclic |
| difuryl ketone | $(C_4H_3O)_2C(O)$, cyclic |
| difuryl ether | $(C_4H_3O)-O-(C_4H_3O)$, cyclic |
| difurfuryl ether | $(C_4H_3O)C(O)-O-C(O)(C_4H_3O)$, cyclic |
| furan, | $C_4H_4O$, (cyclic) |
| 1,4-dioxin, | $C_4H_4O_2$, (cyclic) | and fluorinated carbon derivatives thereof.

The non-silicon containing components can alternatively be mixed with the reactive silicon containing materials that do not contain labile organic groups, such as:

| | |
|---|---|
| methylsilane, | $CH_3-SiH_3$ |
| dimethylsilane, | $(CH_3)_2-SiH_2$ |
| disilanomethane, | $SiH_3-CH_2-SiH_3$ |
| bis(methylsilano)-methane, | $CH_3-SiH_2-CH_2-SiH_2-CH_3$ |
| 2,4,6-trisilaoxane | $-(SiH_2-CH_2-SiH_2-CH_2-SiH_2-O)-$ (cyclic) |
| 1,3,5-trisilacyclohexane, | $-(SiH_2CH_2-)_3-$ (cyclic) |
| cyclo-1,3,5,7-tetrasilano-2,6-dioxy-4,8-dimethylene | $-(SiH_2-CH_2-SiH_2-O-)_2-$ (cyclic) |
| 1,3-dimethyldisiloxane, | $CH_3-SiH_2-O-SiH_2-CH_3$ |
| 1,1,3,3-tetramethyldisiloxane | $(CH_3)_2-SiH-O-SiH-(CH_3)_2$ |
| 1,1,5,5-tetramethyltrisiloxane, and | $(CH_3)_2-SiH-O-SiH_2-O-SiH-(CH_3)_2$ |
| 1,1,3,5,5-pentamethyltrisiloxane | $(CH_3)_2-SiH-O-SiH(CH_3)-O-SiH-(CH_3)_2$ | and the fluorinated carbon derivatives thereof.

A combination of thermally-labile-imparting and non-thermally-labile-imparting compounds can be co-deposited to tailor film properties. A preferred embodiment of the co-deposition compounds include a thermally-labile-imparting compound selected from either methylsilyl-1,4-dioxinyl ether or 2-methylsiloxanyl furan and a non-thermally-labile-imparting compound selected from either 2,4,6-trisilaoxane (2,4,6-trisilatetrahydropyran) or cyclo-1,3,5,7-tetrasilano-2,6-dioxy-4,8-dimethylene.

The co-deposited heteroalicyclic non-thermally-labile imparting molecules which can be used advantageously are non-planar cyclic molecules with insignificant ring strain and which deposit in random orientations. For 2,4,6-trisilaoxane and cyclo-1,3,5,7-tetrasilano-2,6-dioxy-4,8-dimethylene, the dual bonding of the silyl functional groups to the methylene groups can provide improved thermal stability and better mechanical properties of the resultant film. The non-planar molecule can provide a relatively reduced stack density within the deposited film, thereby producing low dielectric films.

After the silicon/oxygen containing material is deposited as a film, the film is preferably annealed at a gradually increasing temperature to convert the labile organic groups to dispersed gas pockets in a nano-porous silicon oxide layer having a low dielectric constant attributed to a preferably closed cell foam structure.

In a preferred embodiment, the nano-porous silicon oxide layer of the present invention is deposited on a PECVD silicon oxide, silicon nitride, silicon oxynitride, or hydrogenated silicon carbide (e.g., BLOk™ layer material available from Applied Materials Inc., of Santa Clara, Calif.) barrier layer that was deposited on a patterned metal layer by plasma assisted reaction of one or more reactive silicon containing compounds. The nano-porous silicon oxide layer is then deposited in the same multichamber clustered CVD system while applying RF power or remote microwave power, and is subsequently heated using an increasing temperature profile, optionally to between about 350° C. to about 400° C. The nano-porous silicon oxide layer is optionally capped in the same chamber or in an adjacent cluster tool processing chamber used to deposit the barrier layer, for example with a hydrogenated silicon carbide (BLOk™). The liner and cap layers serve as barriers which protect the nano-porous silicon oxide layer.

Treatment of the porous silicon oxide layer with a hydrophobic-imparting chemical during or following curing at an elevated temperature, improves the moisture resistance of the deposited film. The chemical used is preferably selected from a group consisting of hexamethyldisilazane, trimethylsilyldiethylamine, phenyldimethylsilyldimethylamine, trimethoxysilyldi-methylamine, tris(trifluoromethyl)silyldimethylamine, bis(trimethyl-silyl)hydrazine, 1-phenyldimethylsilyl-2-methyl-hydrazine, 1-trimethoxysilyl-2-methyl-hydrazine, 1-tris(trifluoromethylsilyl)-2-methyl-hydrazine, trimethylchlorosilane, trimethylbromosilane, trimethylsilane, or combinations thereof.

The liner and cap layers can be deposited by plasma assisted chemical vapor deposition (CVD) of silicon oxide, silicon nitride, silicon oxynitride, or hydrogenated silicon carbide (BLOk™).

Further description of the invention will be directed toward a specific apparatus for depositing nano-porous silicon oxide layers of the present invention.

Exemplary CVD Plasma Reactor

Figure 2:
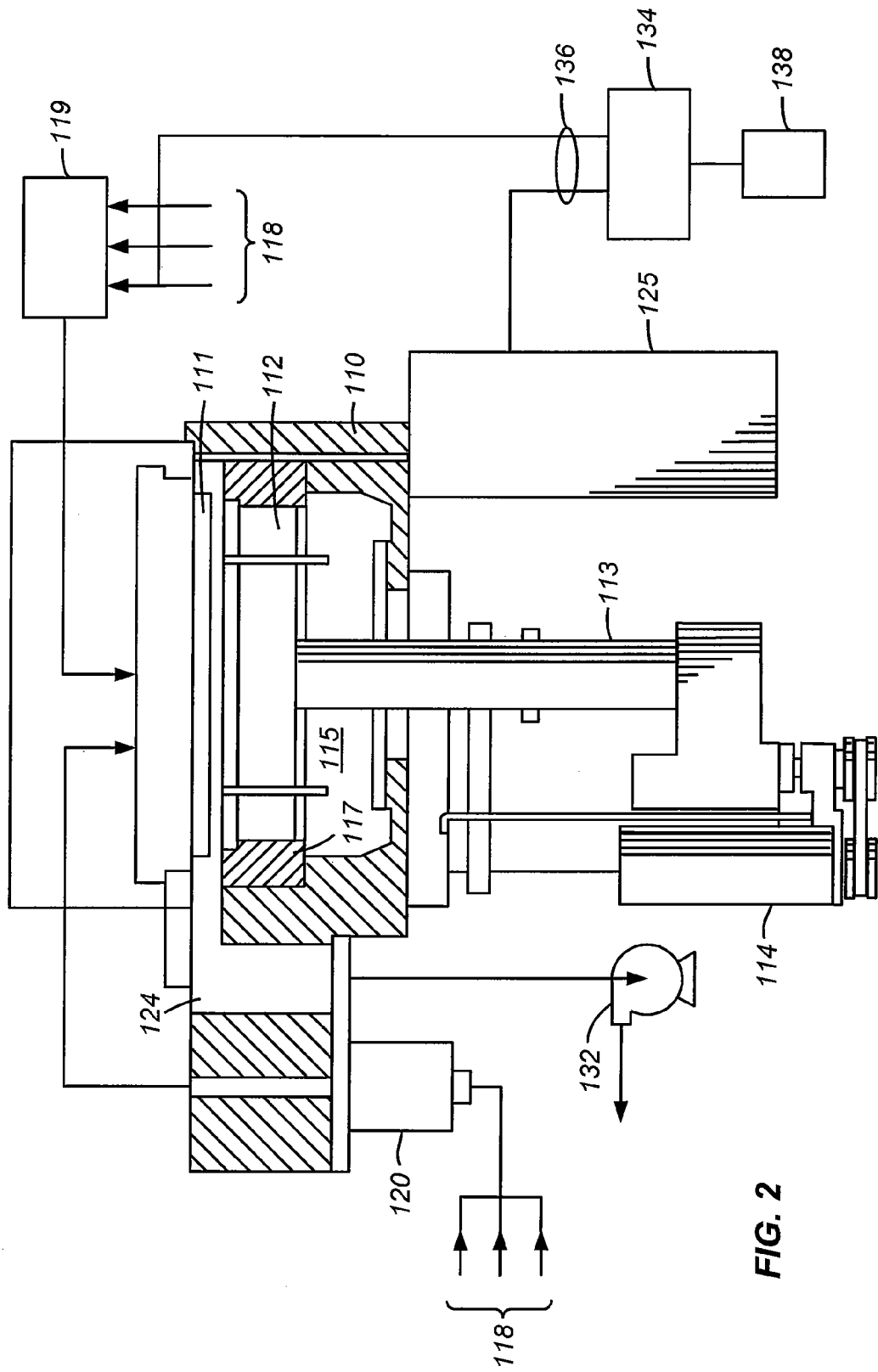
FIG. 2 is a cross-sectional diagram of an exemplary CVD reactor configured for use according to the present invention.

One suitable CVD plasma reactor in which a method of the present invention can be carried out is the "DLK" chamber available from Applied Materials of Santa Clara, Calif., and is shown in FIG. 2, which is a vertical, cross-section view of a parallel plate chemical vapor deposition reactor 110 having a high vacuum region 115. Reactor 110 contains a gas distribution manifold 111 for dispersing process gases through perforated holes in the manifold to a substrate or substrate (not shown) that rests on a substrate support plate or susceptor 112 which is raised or lowered by a lift motor 114. A liquid injection system (not shown), such as typically used for liquid injection of TEOS, may also be provided for injecting a liquid reactant. Preferred liquid injection systems include the AMAT Gas Precision Liquid Injection System (GPLIS) and the AMAT Extended Precision Liquid Injection System (EP-LIS), both available from Applied Materials, Inc.

The reactor 110 includes heating of the process gases and substrate, such as by resistive heating coils (not shown) or external lamps (not shown). Referring to FIG. 2, susceptor 112 is mounted on a support stem 113 so that susceptor 112 (and the substrate supported on the upper surface of susceptor 112) can be controllably moved between a lower loading/offloading position and an upper processing position which is closely adjacent to manifold 111.

When susceptor 112 and the substrate are in processing position 114, they are surrounded by a an insulator 117 and process gases exhaust into a manifold 124. In the specific DLK design shown and described in connection with FIG. 2, the substrate may be seated within a pocket (not shown) in the upper surface of the susceptor, sized to allow a clearance of approximately 2 mm between the edge of the wafer and the pocket wall.

During processing, gases inlet to manifold 111 are uniformly distributed radially across the surface of the substrate. A vacuum pump 132 having a throttle valve controls the exhaust rate of gases from the chamber.

Before reaching manifold 111, deposition and carrier gases are input through gas lines 118 into a mixing system 119 where they are combined and then sent to manifold 111. An optional microwave system 150 (shown in FIG. 3) having an applicator tube 120 may be located on the input gas line for the oxidizing gas to provide additional energy that dissociates only the oxidizing gas prior to entry to the reactor 110. The microwave applicator provides a power from between about 0 and about 6000 W. Generally, the process gases supply lines 18 for each of the process gases include (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations.

The deposition process performed in reactor 110 can be either a non-plasma process on a cooled substrate pedestal or a plasma enhanced process. In a plasma process, a controlled plasma is typically formed adjacent to the substrate by RF energy applied to distribution manifold 111 from RF power supply 125 (with susceptor 112 grounded). Alternatively, RF power can be provided to the susceptor 112 or RF power can be provided to different components at different frequencies. RF power supply 125 can supply either single or mixed frequency RF power to enhance the decomposition of reactive species introduced into the high vacuum region 115. A mixed frequency RF power supply typically supplies power at a high RF frequency (RF1) of about 13.56 MHz to the distribution manifold 111 and at a low RF frequency (RF2) of about 360 KHz to the susceptor 112. The silicon oxide layers of the present invention are most preferably produced using low levels or pulsed levels of high frequency RF power. Pulsed RF power preferably provides 13.56 MHz RF power at about 20 to about 200 W during about 10% to about 30% of the duty cycle. Non-pulsed RF power preferably provides 13.56 MHz RF power at about 10 to about 150 W as described in more detail below. Low power deposition preferably occurs at a temperature range from about −20 to about 40° C. At the preferred temperature range, the deposited film is partially polymerized during deposition and polymerization is completed during subsequent curing of the film.

When additional dissociation of the oxidizing gas is desired, an optional microwave chamber can be used to input from about 0 to about 3000 W of microwave power to the oxidizing gas prior to entering the deposition chamber. Separate addition of microwave power would avoid excessive dissociation of the silicon compounds prior to reaction with the oxidizing gas. A gas distribution plate having separate passages for the silicon compound and the oxidizing gas is preferred when microwave power is added to the oxidizing gas.

Typically, any or all of the chamber lining, gas inlet manifold faceplate, support stem 113, and various other reactor hardware is made out of material such as aluminum or anodized aluminum. An example of such a CVD reactor is described in U.S. Pat. No. 5,000,113, entitled "Thermal CVD/PECVD Reactor and Use for Thermal Chemical Vapor Deposition of Silicon Dioxide and In-situ Multi-step Planarized Process," issued to Wang et al. and assigned to Applied Materials, Inc., the assignee of the present invention.

The lift motor 114 raises and lowers susceptor 112 between a processing position and a lower, substrate-loading position. The motor, the gas mixing system 119, and the RF power supply 125 are controlled by a system controller 134 over control lines 136. The reactor includes analog assemblies, such as mass flow controllers (MFCs) and standard or pulsed RF generators, that are controlled by the system controller 134 which executes system control software stored in a memory 210, which in the preferred embodiment is a hard disk drive. Motors and optical sensors are used to move and determine the position of movable mechanical assemblies such as the throttle valve of the vacuum pump 132 and motor for positioning the susceptor 112.

The system controller 134 controls all of the activities of the CVD reactor and a preferred embodiment of the controller 134 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus.

Figure 3:
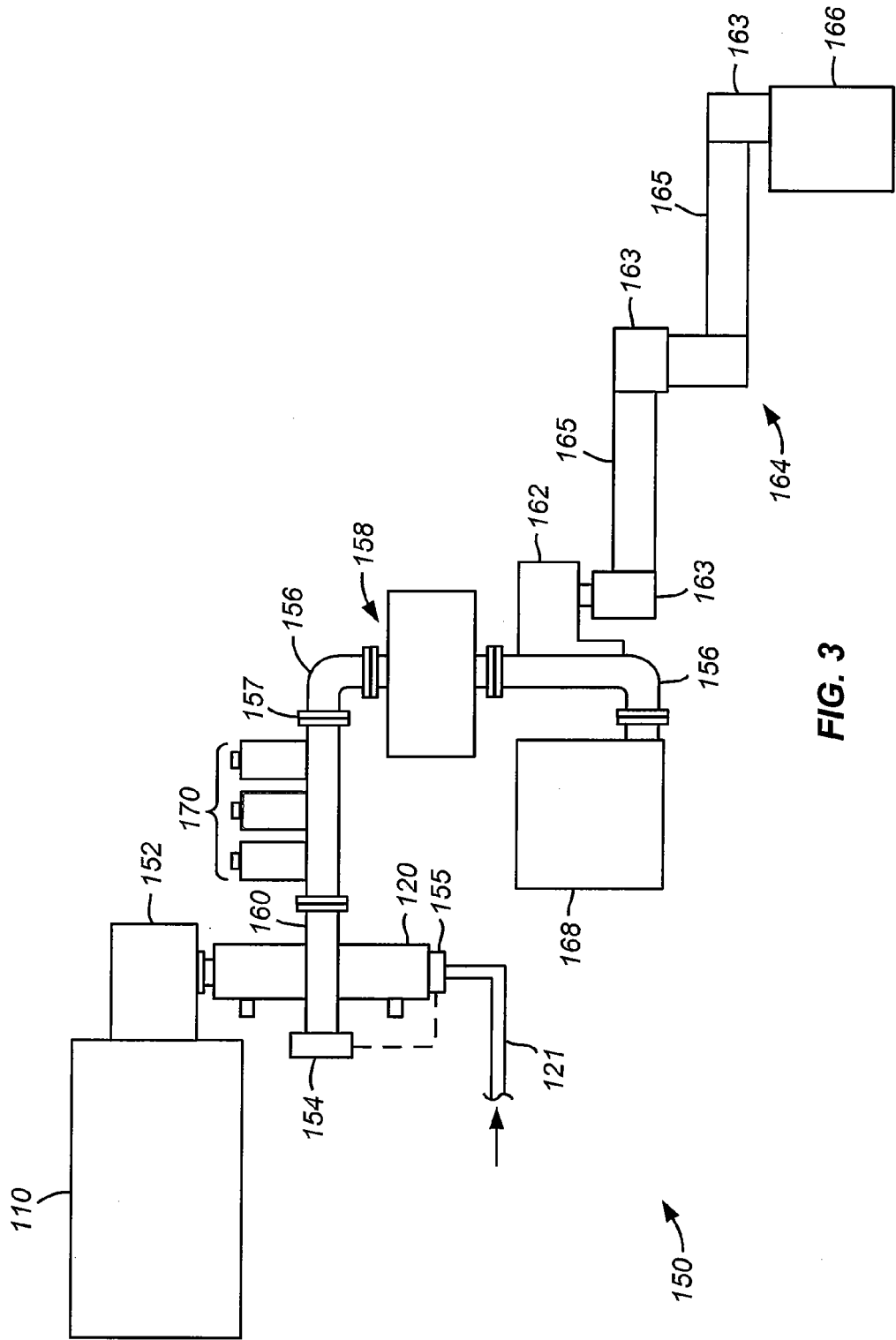
FIG. 3 is a schematic diagram of a remote microwave chamber for dissociation of process gases prior to entering the reactor of FIG. 2.

FIG. 3 is a simplified diagram of a remote microwave system 150 for dissociating process gases such as water prior to entering the DLK reactor 110, in accordance with an embodiment of the present invention. Remote microwave system 150 includes an applicator tube 120, a plasma ignition system including an ultraviolet (UV) lamp 154 and a UV power supply 155, a microwave waveguide system that includes various lengths of straight and curved waveguide sections 156, waveguide coupling 158, which may be connected together at joints 157, an output waveguide section 160, and a magnetron 168. The waveguide section 156 may further have an arm support 162 formed therein for attachment to an pivoting arm 164 mounted on an arm base 166. The pivoting arm comprises arm pieces 165 coupled to arm joints 163 that provide vertical separation of the arm pieces and allow rotational movement of the arm 164 around the arm joints 163. The arm joints 163, are vertically disposed cylinders coupled to one arm piece 165 at the bottom of the arm joint 163 and coupled to a second arm piece 165 at the top of the arm joint 165. The attachment of the arm pieces 165 at the ends of the arm joint 163 allow for vertical separation of the arm pieces and flexibility of position the arm 164, and thus the microwave system 150, during operation and maintenance of the processing reactor 110.

Magnetron 168 is a typical magnetron source capable of operating between about 0-3000 Watts for continuous wave (CW) or pulsed output of microwaves of about 2.45 Gigahertz (GHz) frequency. Of course, other magnetrons may be utilized as well. Circulator (not shown) allows only forward microwave transmission from magnetron 168 toward applicator tube 120. Tuning system 170, which may use stub tuners or other tuning elements, provides the microwave system 150 with the ability to match the load at waveguide section 160 to the characteristic impedance of the waveguides. Tuning system 170 may provide fixed tuning, manual tuning, or automated tuning, according to specific embodiments. In the specific embodiment, the waveguide sections have rectangular cross-sections, but other types of waveguide also may be used.

Applicator tube 120 is a circular (or other cross-section) tube made of a composite or ceramic material, preferably alumina, or other material resistant to etching by radicals. In a specific embodiment, applicator tube 120 has a length of about 18-24 inches and a cross-sectional diameter of about 3-4 inches. Applicator tube 120 is disposed through a waveguide section 160, which is open at one end for transmitting microwaves and is terminated at the other end with a metal wall. Microwaves are transmitted through the open end of waveguide section 160 to gases inside applicator tube 120, which is transparent to microwaves. Of course, other materials such as sapphire also may be used for the interior of applicator tube 120. In other embodiments, applicator tube 120 may have a metal exterior and an interior made of a composite or ceramic material wherein microwaves in waveguide section 160 enter a window through the exterior of applicator tube 120 to the exposed interior of tube 120 to energize the gases.

Figure 4:
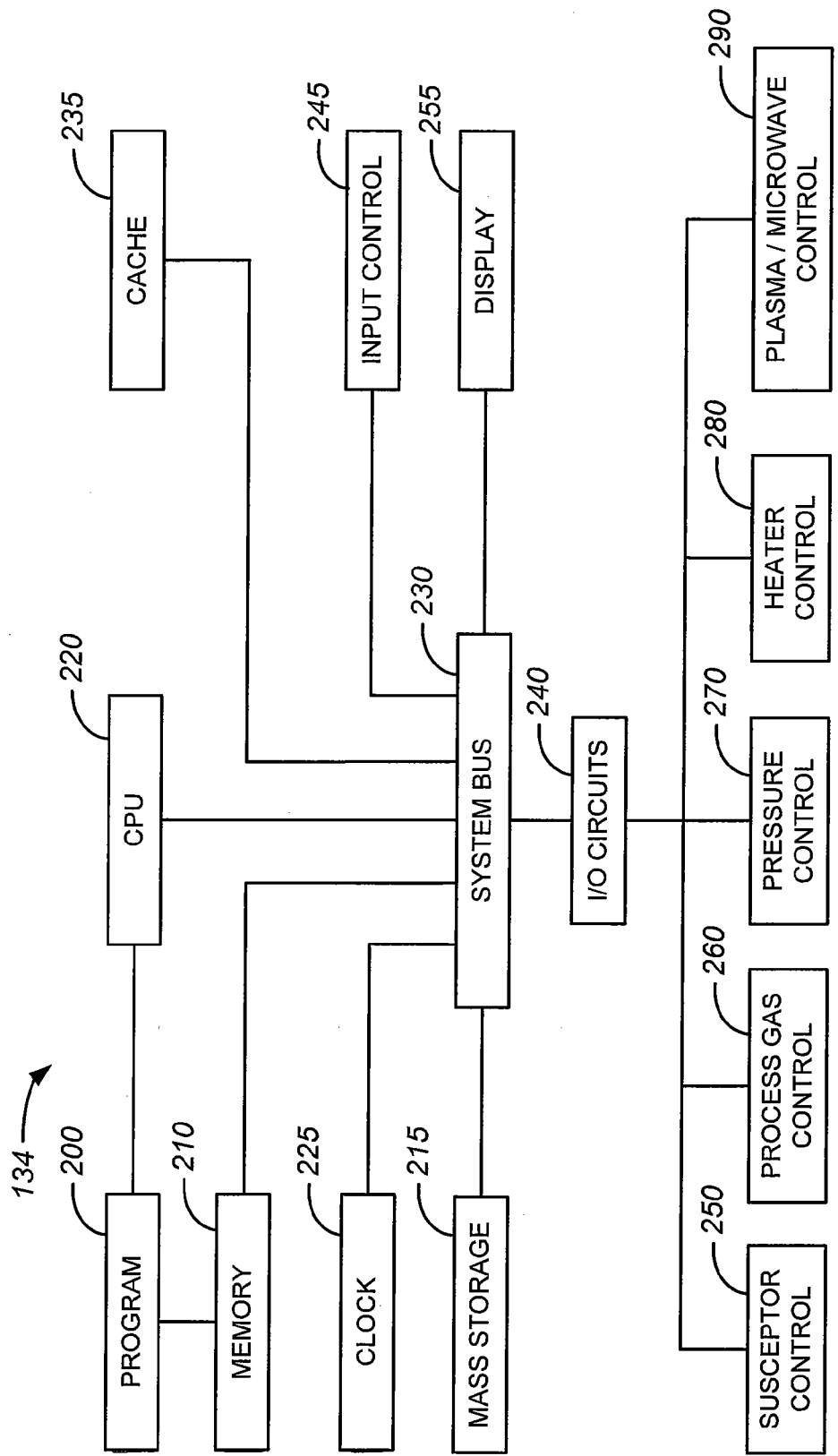
FIG. 4 is a flowchart of a process control computer program product used in conjunction with the exemplary CVD reactor of FIG. 2.

The above-described method can be implemented in a system that is controlled by a processor based system controller such as the controller 134 shown in FIG. 2. FIG. 4 shows a block diagram of a processing system, or reactor 110, such as that depicted in FIG. 2, having such a system controller 134 that can be employed in such a capacity. The system controller 134 includes a programmable central processing unit (CPU) 220 that is operable with a memory 210, a mass storage device 215, an input control unit 245, and a display unit 255. The system controller further includes well-known support circuits 214 such as power supplies, clocks 225, cache 235, input/output (I/O) circuits 240 and the like, coupled to the various components of the DLK process reactor 110 to facilitate control of the deposition process. The controller 134 also includes hardware for monitoring substrate processing through sensors (not shown) in the chamber 110. Such sensors measure system parameters such as substrate temperature, chamber atmosphere pressure and the like. All of the above elements are coupled to a control system bus 230.

To facilitate control of the chamber as described above, the CPU 220 may be one of any form of general purpose computer processor that can be used in an industrial setting for controlling various chambers and subprocessors. The memory 210 is coupled to the CPU 220, and is accessible to the system bus 230. The memory 210, or computer-readable medium 215, may be one or more of readily available memory such as random access memory (RAM), read only memory (ROM), floppy disk drive, hard disk, or any other form of digital storage, local or remote. The support circuits 214 are coupled to the CPU 220 for supporting the processor in a conventional manner. The deposition process is generally stored in the memory 210, typically as a software routine. The software routine may also be stored and/or executed by a second CPU (not shown) that is remotely located from the hardware being controlled by the CPU 220.

The memory 210 contains instructions that the CPU 220 executes to facilitate the performance of the processing system 10. The instructions in the memory 210 are in the form of program code such as a program 200 that implements the method of the present invention. The program code may conform to any one of a number of different programming languages. For example, the program code can be written in C, C++, BASIC, Pascal, or a number of other languages.

The mass storage device 215 stores data and instructions are retrieves data and program code instructions from a processor readable storage medium, such as a magnetic disk or magnetic tape. For example, the mass storage device 215 can be a hard disk drive, floppy disk drive, tape drive, or optical disk drive. The mass storage device 215 stores and retrieves the instructions in response to directions that it receives from the CPU 220. Data and program code instructions that are stored and retrieved by the mass storage device 215 are employed by the processor unit 220 for operating the processing system. The data and program code instructions are first retrieved by the mass storage device 215 from a medium and then transferred to the memory 210 for use by the CPU 220.

The input control unit 245 couples a data input device, such as a keyboard, mouse, or light pen, to the processor unit 220 via the system bus 230 to provide for the receipt of a chamber operator's inputs. The display unit 255 provides information to a chamber operator in the form of graphical displays and alphanumeric characters under control of the CPU 220.

The control system bus 230 provides for the transfer of data and control signals between all of the devices that are coupled to the control system bus 230. Although the control system bus is displayed as a single bus that directly connects the devices in the CPU 220, the control system bus 230 can also be a collection of busses. For example, the display unit 255, input control unit 245 (with input device), and mass storage device 215 can be coupled to an input-output peripheral bus, while the CPU 220 and memory 210 are coupled to a local processor bus. The local processor bus and input-output peripheral bus are coupled together to form the control system bus 230.

The system controller 134 is coupled to the elements of the processing system 10, employed in dielectric deposition processes in accordance with the present invention via the system bus 230 and the I/O circuits 240. The I/O circuits 240 receive instructions from the program 200 stored in memory 210 via the CPU 220 and system bus 230. The program 200 provides program subroutines that enable the I/O circuits 240 to provide for substrate positioning control 250, process gas control 260, pressure control 270, heater control 280, and plasma/microwave control 290, of the reactor 110.

The CPU 220 forms a general purpose computer that becomes a specific purpose computer when executing programs such as the program 200 of the embodiment of the method of the present invention depicted in the flow diagram of FIG. 4. Although the invention is described herein as being implemented in software and executed upon a general-purpose computer, those skilled in the art will realize that the invention could be implemented using hardware such as an application specific integrated circuit (ASIC) or other hardware circuitry. As such, it should be understood that the invention can be implemented, in whole or in part, in software, hardware or both.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the substrate could be supported and heated by a resistively heated susceptor. The pretreatment and method for forming a pretreated layer of the present invention is not limited to any specific apparatus or plasma excitation method. The use of other apparatuses is discussed in detail below.

Deposition of a Nano-Porous Silicon Oxide Layer

Figure 5:
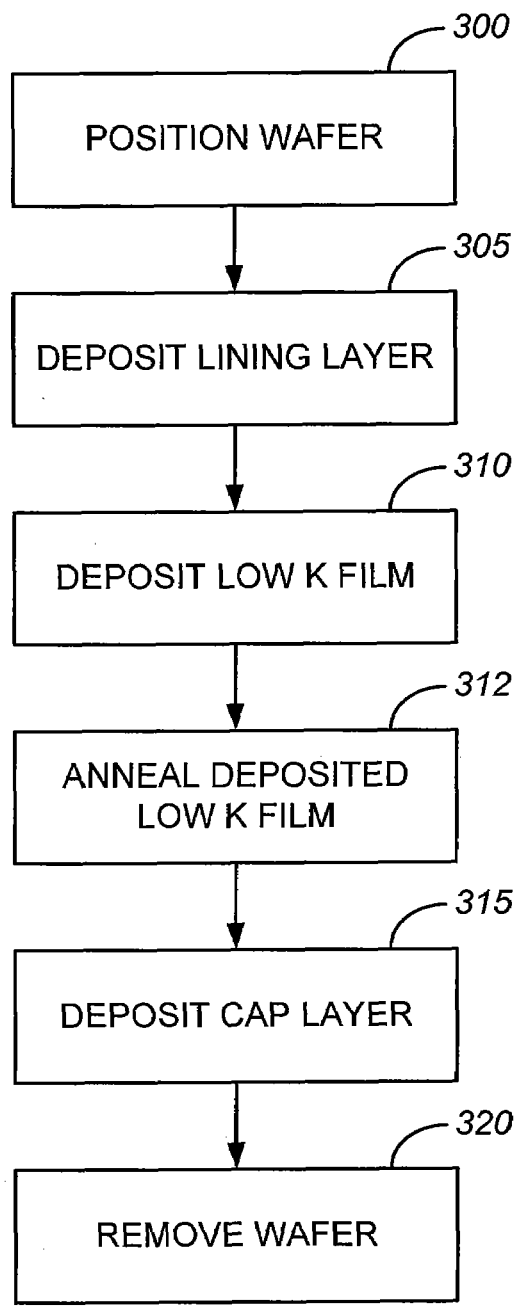
FIG. 5 is a flow chart illustrating steps undertaken in depositing liner and cap layers in a deposition process according to one embodiment of the present invention.

The nano-porous silicon oxide layer of the present invention can be deposited in a three-layer process as shown in FIG. 5 using the PECVD or microwave chamber of FIG. 2. Referring to FIG. 5, a substrate is positioned 300 in the reactor 110 and a barrier layer is deposited 305 by a PECVD process from a plasma comprising a reactive silicon containing compound. The deposition step 305 can include a capacitively coupled plasma or both an inductively and a capacitively coupled plasma in the process chamber 15 according to methods known in the art. An inert gas such as helium is commonly used in the PECVD deposition to assist in plasma generation. A nano-porous layer of the present invention is then deposited 310 on the liner layer by depositing a silicon/oxygen containing material that further contains labile organic groups.

As discussed in detail below, reduction in the stress of films as-deposited may be accomplished by performing plasma-enhanced deposition at temperatures below 300° C.

In step 312, controlled annealing of the deposited silicon/oxygen containing material results in the formation of microscopic gas pockets that are uniformly dispersed in the layer. As described in detail below, in accordance with embodiments of the present invention, this controlled annealing may take place in multiple stages under different conditions, for example by the application of thermal radiation followed by exposure to electron beam radiation.

As also discussed in detail below, a reduction in the stress of after annealing may be achieved by the liberation of porogens incorporated within the as-deposited film Next, a cap layer is then deposited 315 on the layer, preferably using a similar process as employed for depositing the lining layer. The substrate is then removed 320 from the reactor 110.

Referring to FIGS. 6A-6E, the three-layer process provides a PECVD lining layer 400. The lining layer 400 acts as an isolation layer between the subsequent nano-porous layer 402 and the underlying substrate surface 404 and metal lines 406, 408, 410 formed on the substrate surface. The nano-porous layer 402 is capped by a PECVD capping layer 412 of the silicon containing compound. This process is implemented and controlled using a computer program stored in the memory 220 of a computer controller 134 for a CVD reactor 110.

Figure 6A:
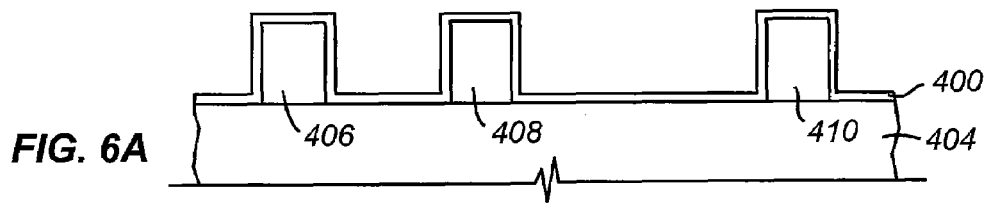
FIGS. 6A-6E are schematic diagrams of the layers deposited on a substrate by the process of FIG. 5.

Referring to FIG. 6A, the PECVD lining layer 400 is deposited in the reactor 110 by introducing a reactive silicon containing compound and an oxidizing gas. The process gases react in a plasma enhanced environment to form a conformal silicon oxide layer 400 on the substrate surface 404 and metal lines 406, 408, 410.

Figure 6B:
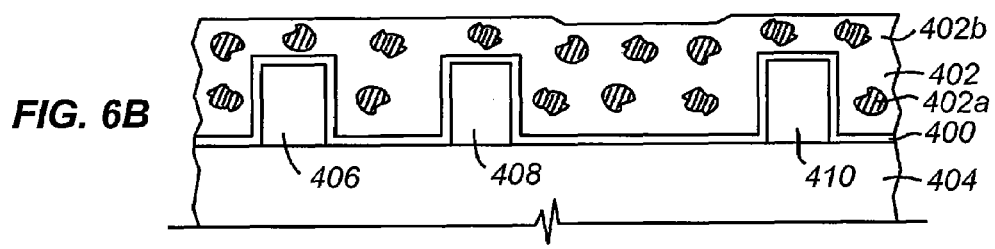

Referring to FIG. 6B, the nano-porous layer 402 is deposited from a processing gas consisting of silicon and labile containing compounds and an oxidizing gas. The process gas flows range from about 20 to about 1000 sccm for the silicon and labile containing compounds, and about 5 to about 4000 sccm of the oxidizing gas. The preferred gas flows range from about 50 to about 500 sccm for the silicon and labile containing compounds and a flow rate of about 5 to about 2000 sccm of the oxidizing gas. These flow rates are given for a chamber having a volume of approximately 5.5 to 6.5 liters. Preferably, reactor 110 is maintained at a pressure of about 0.2 to about 5 Torr during deposition of the nano-porous layer 402.

Figure 6C:
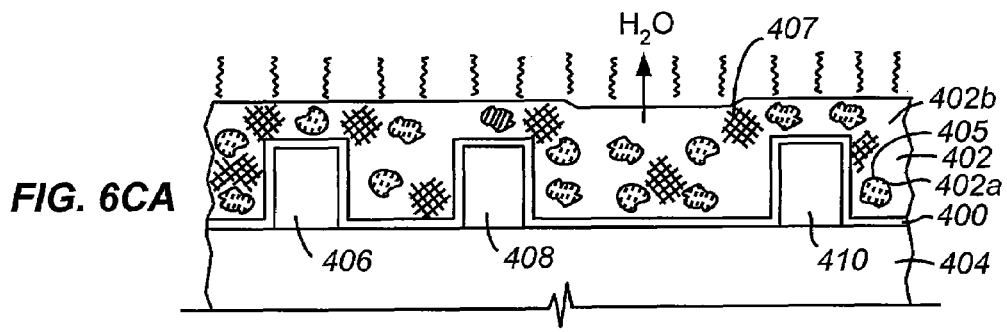
Figure 6C:
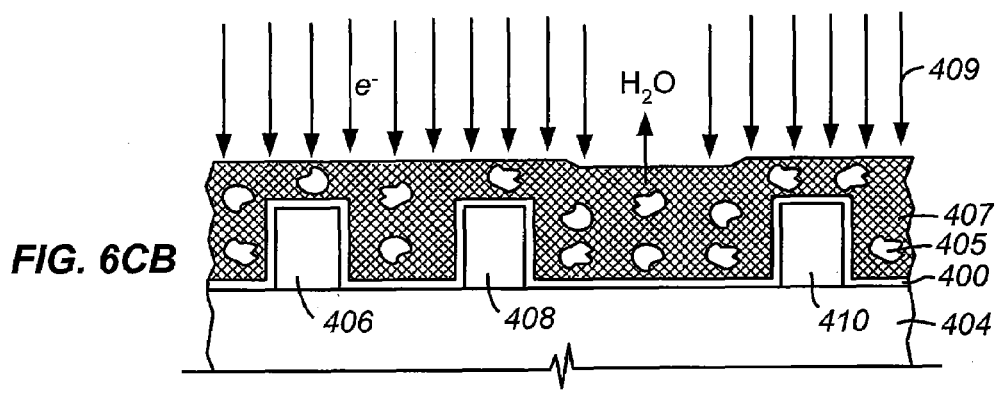
Figure 6D:
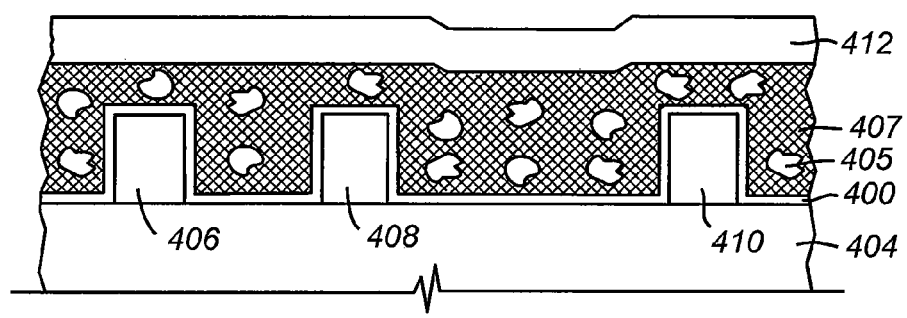

The nano-porous layer 402 is cured as shown in FIGS. 6CA-CB to remove volatile constituents prior to deposition of a cap layer 412 as shown in FIG. 6D. As described in detail below in conjunction with FIGS. 6CA-6CB, the as-deposited low K films may be cured in a multi-stage approach in accordance with embodiments of the present invention. Such multi-stage curing may involve a thermal cure step followed by an electron beam cure step. Alternatively, the thermal cure may be preceded by an electron beam cure.

Alternatively, curing can be performed in the reactor 110 under an inert gas atmosphere while heating the substrate to progressively higher temperatures. The nano-porous layer 402 may be annealed at a gradually increasing temperature to retain gaseous products as dispersed microscopic bubbles, and/or to convert the optional labile organic groups to dispersed microscopic gas bubbles that are retained in the cured silicon oxide film as voids in a preferably closed cell structure. A preferred anneal process comprises a heating time period of about 5 minutes, including gradually raising the temperature by about 50° C./min. to a final temperature of between about 350° C. to about 400° C. Dispersion of the gas bubbles can be controlled by varying the temperature/time profile and by controlling the concentration of labile organic groups in the deposited film.

Figure 6E:
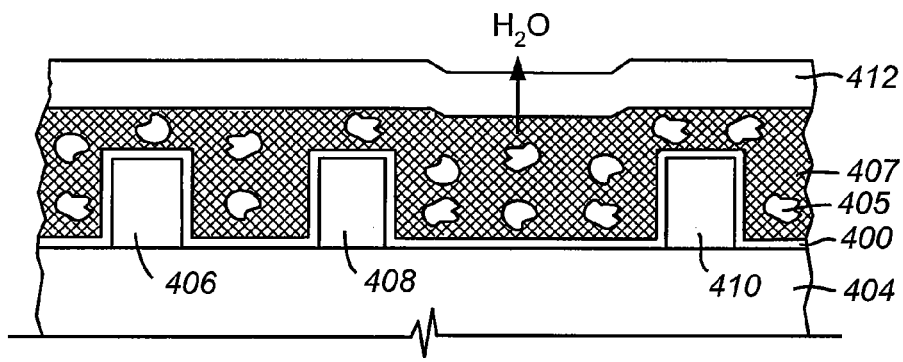

Referring to FIG. 6D, the reactor 110 deposits a capping layer 412, preferably of the same material and by the same methods as used for the deposition of the PECVD liner layer 400. Referring to FIG. 6E, after deposition of the capping layer 412, the deposited layers are further annealed in a furnace or another chamber at a temperature from about 200° C. to about 450° C. to drive off remaining volatile products such as water. Of course, processing conditions will vary according to the desired characteristics of the deposited films.

Reduction of Stress in Low K Film

Low K dielectric materials in accordance with the present invention may be formed between successive layers of interconnect metallization. Such metallization is typically formed from relatively rigid materials such as copper or aluminum. As low K films are generally soft materials, the integration of these films having substantially different physical properties is becoming increasingly difficult.

Film stress is one key factor in determining the strength of a film as well as its elastic modulus. Therefore, the production of low-K films exhibiting low stress is important to aid in the incorporation of such films into semiconductor structures and devices.

In accordance with one embodiment of the present invention, a low K film having a film stress of less than about 20 MPa may be formed by chemical vapor deposition at a low temperatures of below 300° C. The reduced thermal budget of such a deposition process reduces the amount of mechanical stress resulting in the film. TABLE 1 provides a summary of the parameters of a number of deposition processes for a carbon-containing silicon oxide film formed in accordance with an embodiment of the present invention.

TABLE 1

Pressure = 6 Torr
Faceplate-to-Wafer Spacing = 800 mils
Radio Frequency Power = 500 W
Low Frequency Power = 200 W

| temp (° C.) | OMCTS (mgm) | $C_2H_4$ (sccm) | He (sccm) | $O_2$ (sccm) | Stress (MPa) |
|---|---|---|---|---|---|
| 150 | 2200 | 6000 | 4400 | 300 | −15.3 |
| 200 | 2200 | 6000 | 4400 | 300 | −8.2 |
| 150 | 3200 | 4800 | 6400 | 400 | −6.2 |
| 200 | 3200 | 4800 | 6400 | 400 | 7.985 |

In the last column of TABLE 1, a positive value for stress indicates that the deposited film exhibits tensile stress. A negative stress value indicates that the deposited film exhibits compressive stress. Embodiments of films in accordance with the present invention would be expected to exhibit a stress of about 20 MPa or less.

The stress of the films deposited under the conditions of TABLE 1 may be compared with stresses exhibited by films of the same composition deposited under different conditions. For example, a similar carbon doped silicon oxide film deposited at 350° C. exhibited a tensile stress of 56.2 MPa.

Embodiments of carbon doped silicon oxide films in accordance with the present invention are not limited to the specific parameters described above, but may be deposited under a range of conditions. TABLE 2 below summarizes this range of conditions.

TABLE 2

| PROCESS PARAMETER | RANGE |
|---|---|
| Deposition Temperature | <300° C. |
| Deposition Pressure | 2–10 Torr |
| RF Power | 200–1500 Watt |
| Faceplate-To-Wafer Spacing | 300–1000 (mils) |

While the above discussion has focused upon the deposition of low K films at low temperatures to achieve low stress, embodiments in accordance with the present invention are not limited to this approach. In accordance with alternative embodiments of the present invention, a film with low tensile stress or even compressive stress may be formed by deposition in conjunction with a porogen, such that subsequent liberation of the porogen results in a lessening of stress in the material.

TABLE 3 illustrates stress data from films deposited with, and without, the porogens.

TABLE 3

Deposition Temperature = 225° C.;
RF power = 1200 W;
Deposition Pressure = 8 Torr;
Faceplate to Wafer Spacing = 300 mil;
Flow Rate of Silicon Precursor = 1200 mgm;
Flow Rate of Helium = 3000 sccm;
Flow Rate of Oxygen = 200 sccm;

| RUN # | POROGEN FLOW RATE (mgm) | STRESS AS DEPOSITED (MPa) | STRESS POST-TREATMENT (MPa) | Δ STRESS (MPa) |
|---|---|---|---|---|
| 1 | 3000 | 16.43 | 56.04 | 39.61 |
| 2 | 0 | −20.86 | 79 | 99.86 |

TABLE 3 shows that the carbon-doped silicon oxide deposited with the porogen incorporated therein, exhibited a substantially reduced increase in stress upon treatment of the as-deposited film with an electron beam, as compared with the a film deposited under the same conditions without the porogen.

Figure 9:
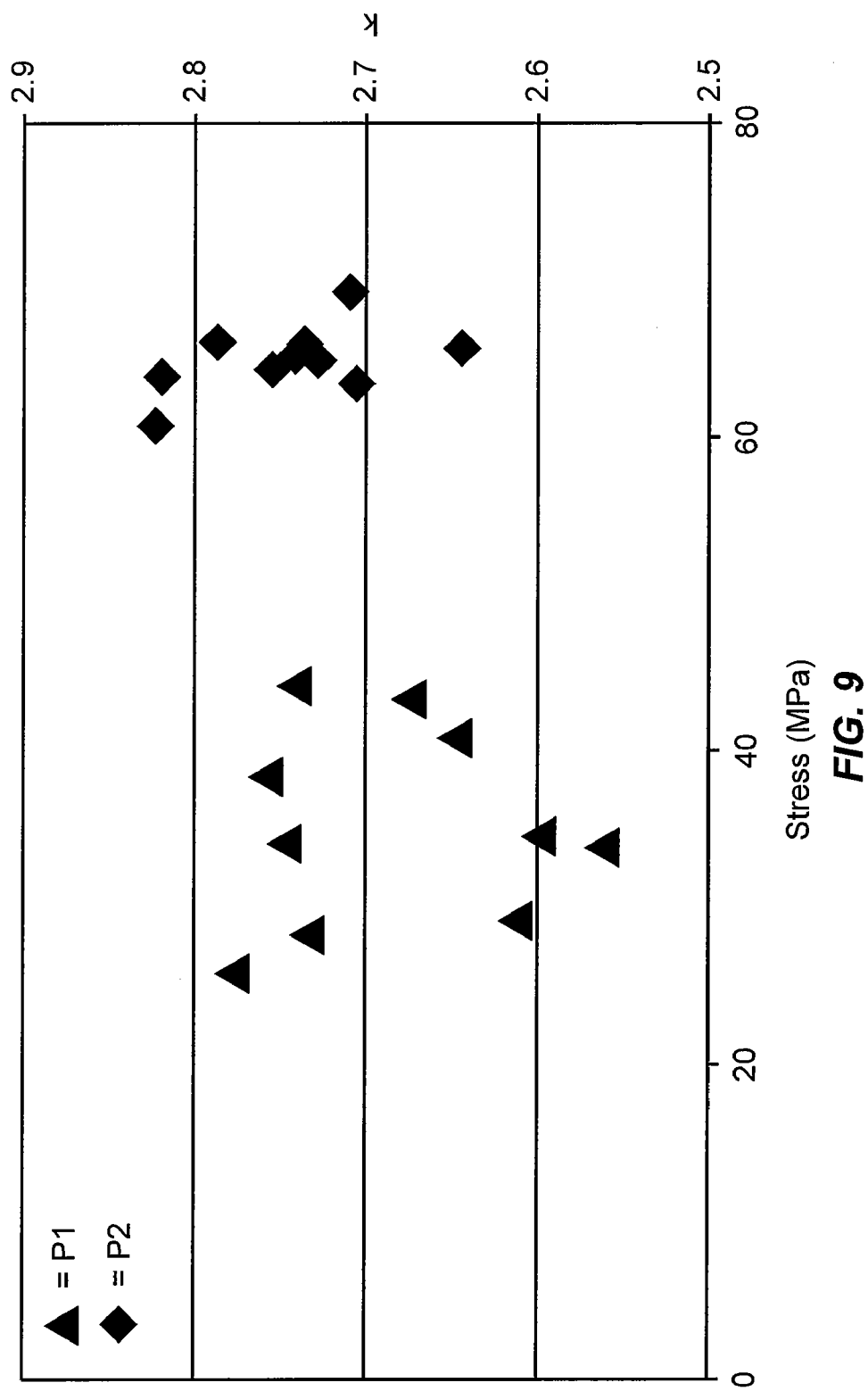
FIG. 9 plots dielectric constant (K) versus film stress for a films deposited with one of two different porogen types.

The nature of the incorporated porogen can also affect the resulting stress of the deposited film. FIG. 9 plots dielectric constant versus stress, for films incorporating different types of porogen. A first porogen type (P1) comprises a cyclic molecule occupying a larger volume than a second porogen type (P2) comprising a linear molecule. FIG. 9 indicates that film deposited with the larger porogen type P1, consistently exhibited less stress upon post-deposition annealing.

Although a variety of sources of electron beam radiation may be employed during an annealing process, one exemplary device is the EBK chamber, available from Applied Materials, Inc., of Santa Clara Calif. Such a large-area uniform electron source is also described in U.S. Pat. No. 5,003,128, incorporated by reference herein for all purposes. The following patents, also incorporated herein by reference for all purposes, describe various aspects of electron beam processing: U.S. Pat. No. 5,468,595, U.S. Pat. Nos. 6,132,814, 6,204,201, 6,207,555, 6,271,146, 6,319,655, 6,407,399, 6,150,070, 6,218,090, 6,195,246, 6,218,090, 6,426,127, 6,340,556, 6,358,670, and 6,255,035, 6,607,991, 6,551,926, 6,548,899, 6,489,225, and 6,582,777. E-beam processing is also described more fully in U.S. patent application Ser. No. 10/302,375 (AMAT-7625), entitled, "Method For Curing Low Dielectric Constant Film By Electron Beam", filed on Nov. 22, 2002 and incorporated by reference herein for all purposes.

The electron beams are generally generated at a pressure of about 1 mTorr to about 100 mTorr. The electron beam may be formed in an ambient comprising an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 2 mA to about 20 mA. The electron beam may cover an area from about 4 square inches to about 700 square inches. The e-beam process apparatus operates ranges from about 25° C. to about 450° C., e.g., about 400° C.

An e-beam cure treatment in accordance with an embodiment of the present invention may comprise the application or exposure to a dosage of less than 500 micro coulombs per square centimeter ($\mu C/cm^2$), and preferably between about 20 and 250 $\mu C/cm^2$, for example, about 150 $\mu C/cm^2$. The energy of electron beam curing may range from between about 0.5 kiloelectron volts (KeV) and about 30 KeV, for example between about 2 keV and about 10 keV, such as 4 keV.

Dosages of the applied electron beam radiation may vary. For example, a dosage between about 10-1000 $\mu C/cm^2$ has been observed to result in curing of layers formed on 200 mm and 300 mm substrates.

In the specific embodiment of a multi-step curing process described above and shown in FIGS. 6CA-CB, thermal curing precedes e-beam curing. This specific order of curing stages may prove advantageous in that the electron beam radiation may interact more strongly with the surface of the as-deposited layer, thereby promoting a surface cross-linking reaction to form a crust-like or densified, cross-linked surface layer. Such a surface layer may block or otherwise inhibit outgassing of porogens incorporated into the film, which are to be liberated during the curing process.

However, embodiments in accordance with the present invention do not require a multi-stage curing process wherein electron beam irradiation is preceded by thermal exposure. In accordance with certain alternative embodiments, a thermal cure may be preceded by an electron beam cure. Such an alternative order of curing steps may prove advantageous, for example, wherein electron beam processing results in formation a surface crust affects the outgassing of materials in a desirable way. Such an alternative order of curing steps may also prove advantageous by maintaining high throughput, as the thermal cure step is typically a batch process that can be performed following irradiation of individual wafers.

Moreover, conditions of each of the stages in the multi-stage curing process may be varied to obtain desired characteristics of the cured film. For example, in the thermal annealing stage, the duration and temperature change profile can be changed. Moreover, in the electron beam curing stage, the dose, energy, and current of the applied electron beam radiation can be controlled.

Another condition which may be varied during the multi-stage curing process in accordance with embodiments of the present invention, includes, the composition of the gaseous ambient that is present during one or more of the curing stages. Embodiments of gases which may be present during one or more of the curing stages include, but are not limited to, molecular oxygen ($O_2$), molecular nitrogen ($N_2$), molecular hydrogen ($H_2$), and noble gases such as helium (He).

And while the above description relates to a multi-stage curing process utilizing thermal and electron beam energy, this is also not required by the present invention. In accordance with certain alternative embodiments, multiple e-beam exposure steps performed under different conditions may be employed to cure the deposited low K film.

For example, during the treatment, the ebeam treatment dose can be varied from a low value to a high value or from a high value to a low value. Alternatively, the ebeam dose can be stepped up or down during the treatment. Similarly, the cathode voltage can be stepped up or stepped down during the treatment.

Deposition of a Dual Damascene Structure

Figure 7:
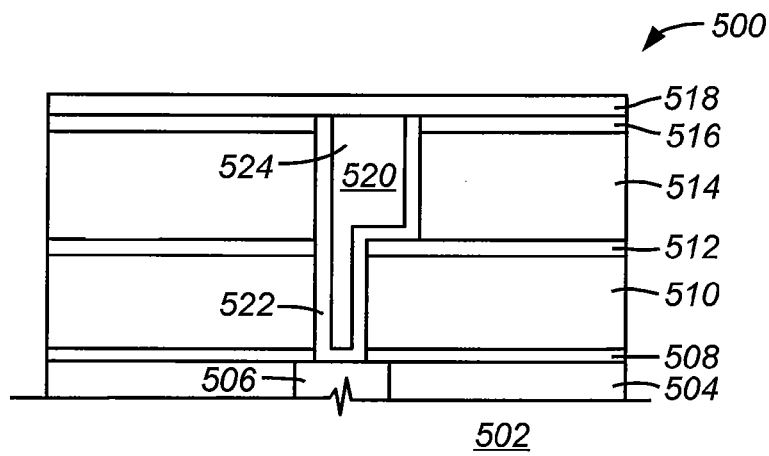
FIG. 7 is a cross sectional view showing a dual damascene structure comprising the silicon oxide layers of the present invention.

A preferred dual damascene structure 500 fabricated in accordance with the invention is shown in FIG. 7, and the method of making the structure is sequentially depicted schematically in FIGS. 8A-8H, which are cross sectional views of a substrate having the steps of the invention formed thereon.

A dual damascene structure 500 which includes a nano-porous intermetal dielectric layer 510 is shown in FIG. 7. The intermetal dielectric layers 510 and 514 deposited according to the invention have extremely low dielectric constants of less than 3, and are often referred to as extreme low k, or ELk, dielectric layers. A first dielectric layer 510, preferably consisting of the nano-porous silicon oxide layer of the present invention is deposited on a substrate 502. The substrate comprising patterned conducting lines 506 formed in a contact level substrate material 504, with a first (or substrate) etch stop 508 of silicon oxide, silicon nitride, silicon oxynitride, or amorphous hydrogenated silicon carbide (BLOk™), preferably silicon nitride, deposited thereon.

The deposited dielectric layer 510 may then be annealed in multiple stages as described above, freeing the labile groups and forming the nano-pores of the ultra low K material.

A silicon oxide, silicon nitride, silicon oxynitride, or hydrogenated silicon carbide (BLOk™) second etch stop 512 is deposited on the first dielectric layer 510.

A second dielectric layer 514, preferably consisting of the nano-porous silicon oxide layer of the present invention is deposited on the second etch stop 512, with a third etch stop 516 deposited on the second dielectric layer 514. After deposition, the second dielectric layer 514 may also be annealed in multiple stages to create the nano-pores therein, which reduce the K value of the material.

The deposited layers are etched to form a via 520, which is subsequently filled with a conducting metal 524, preferably copper, over a barrier layer 522 conformally deposited within the via 520. The structure is then planarized and a capping layer 518 comprising silicon nitride, silicon oxide, silicon oxynitride, or hydrogenated silicon carbide, preferably comprising silicon nitride, is deposited thereon. The capping layer 518 also serves as the substrate etch stop and corresponds to the first etch stop 508 for subsequent dual damascene multi-level interconnects.

Figure 8A:
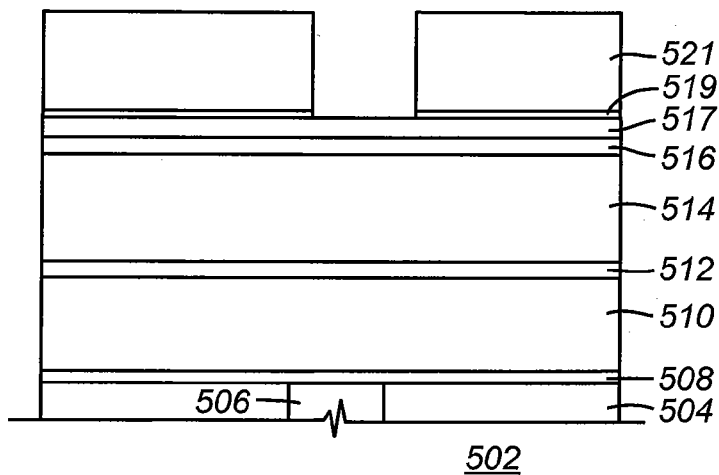
FIGS. 8A-8H are cross-sectional views showing one embodiment of a dual damascene deposition sequence of the present invention.

As shown in FIG. 8A, a first (or substrate) etch stop 508 of silicon oxide, silicon nitride, silicon oxynitride, or amorphous hydrogenated silicon carbide, preferably silicon nitride is deposited to a thickness of about 1000 Å on the substrate 502. The substrate 502 comprises patterned conducting interconnects or lines 506 formed in a contact level substrate material 504. A first nano-porous dielectric layer 510 is deposited according to the invention on the first etch stop 508. The first dielectric layer 510 has a thickness of about 5,000 Å to about 10,000 Å, depending on the size of the structure to be fabricated, but has a preferable thickness of about 5,000 Å. The first dielectric layer 510 is then annealed at a temperature of about 350° C. to about 400° C. to remove volatile contaminants from the layer 510. In a second annealing stage, in accordance with embodiments of the present invention, the first dielectric layer 510 is exposed to e-beam radiation.

A second etch stop 512, such as silicon oxynitride, is deposited on the dielectric layer 510 to a thickness of about 500 Å. A second nano-porous dielectric layer 514 is then deposited a thickness of about 5,000 Å to about 10,000 Å, preferably about 5,000 Å, according to the invention on the first etch stop 508, and is then annealed at a temperature of about 350° C. to about 400° C. In a second annealing stage, the second dielectric layer 514 is exposed to e-beam radiation.

A third etch stop 516 of silicon oxide, silicon nitride, silicon oxynitride, or amorphous hydrogenated silicon carbide (BLOk™), preferably silicon nitride is deposited on the second dielectric layer 514 to a thickness of about 500 Å to about 1000 Å, preferably at about 1000 Å. A silicon oxide layer 517 having a thickness of about 2000 Å is the deposited on the third etch stop 516 to serve both as a hard etch mask as well as for future use in a chemical mechanical polishing (CMP) step. An anti-reflective coating (ARC) 519 and a trench photomask comprising a photoresist layer 521 are then respectfully deposited over the silicon oxide layer 517. The photoresist layer 521 is then patterned by conventional photolithography means known in the art.

Figure 8B:
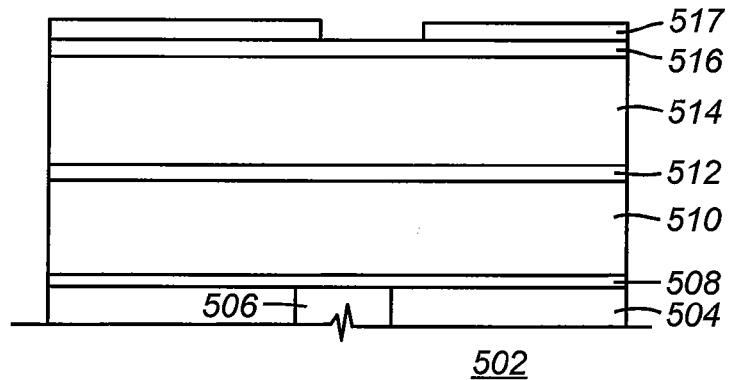
Figure 8C:
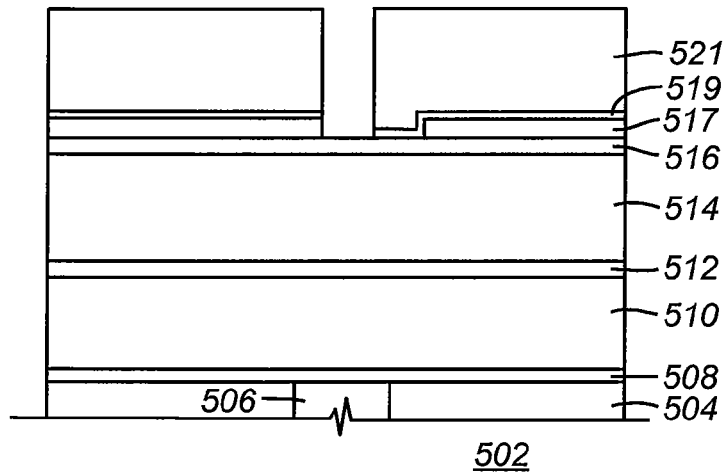

The silicon oxide layer 517 is then etched by conventional means known in the art, preferably by an etch process using fluorocarbon chemistry, to expose the third etch 516 as shown in FIG. 8B. The initial etch of the silicon oxide layer 517 establishes the opening width, or trench width, of the dual damascene structure 500. The opening width formed in the silicon oxide layer 517 defines the horizontal interconnect of the dual damascene structure 500 formed above the second etch stop 514. The remaining photoresist 521 is then ashed, or dry removed, for preparation of the via etch. For formation of the contact or via width of the dual damascene structure, a second anti-reflective coating 519 and a photoresist layer 521 are then respectfully deposited over the thin silicon oxide layer 517, and then patterned by photolithography to expose the third etch layer 516 by the via width as shown in FIG. 8C.

Figure 8D:
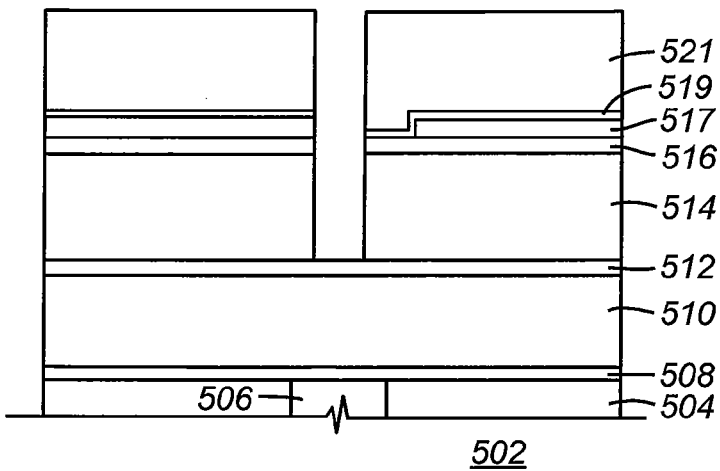
Figure 8E:
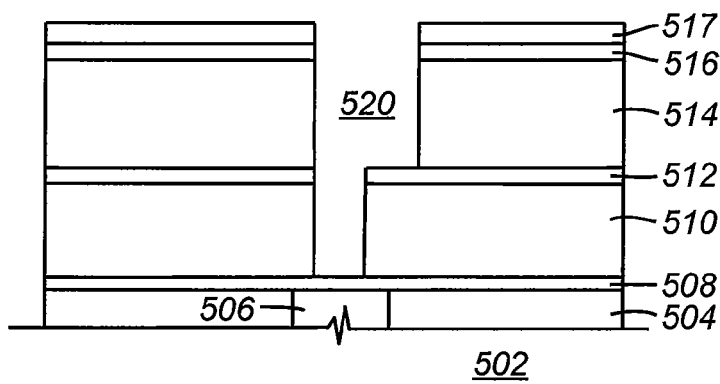
Figure 8F:
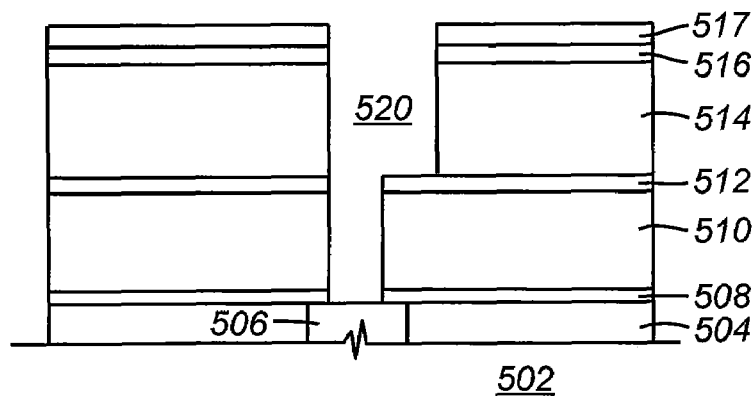

Referring to FIG. 8D, the third etch stop 516 and second dielectric layer 514, are trenched etched to expose the second etch stop 512. The via 520 is then formed by via etching the second dielectric layer 514 to the second etch stop 512 using anisotropic etching techniques to define the metallization structure (i.e., the interconnect and contact/via) at the width established by the silicon oxide layer 517; and etching the first dielectric layer 510 to the first etch stop 508 at the via width established during the etching of the third etch stop 516, second dielectric layer 514, and the second etch stop 512 as shown in FIG. 8E. Any photoresist or ARC material used to pattern the second etch stop 512 or the second dielectric layer 514 is removed using an oxygen strip or other suitable process. FIG. 8F shows the etching of the first etch stop 508 protecting the substrate 502, exposing the underlying patterned metal lines 506 in the contact level substrate material 504. The patterned metal lines 506 preferably comprise a conducting metal such as copper. The dual damascene structure 500 is then precleaned by conventional means known in the art prior to subsequent layer deposition.

Figure 8G:
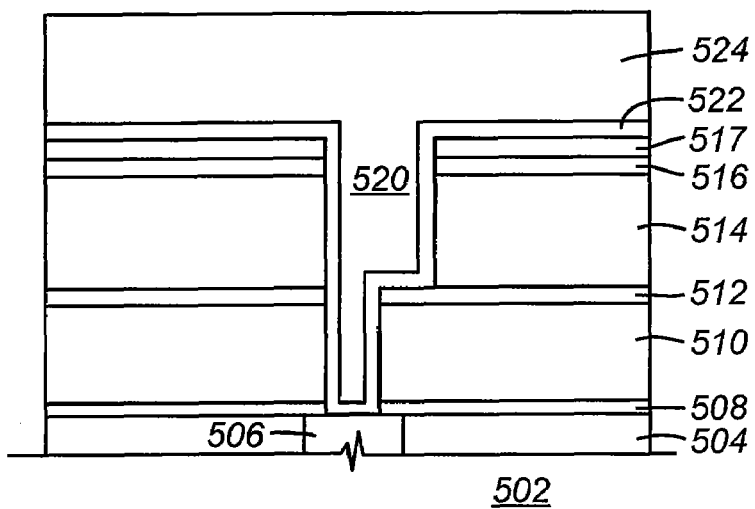
Figure 8H:
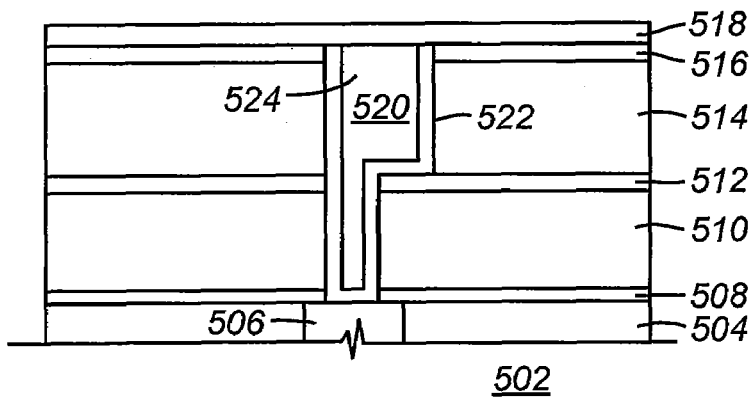

The metallization structure is then formed with a conductive material such as aluminum, copper, tungsten or combinations thereof. Presently, the trend is to use copper to form the smaller features due to the low resistivity of copper (1.7 mW-cm compared to 3.1 mW-cm for aluminum). Preferably, as shown in FIG. 8G, a suitable barrier layer 522 such as tantalum nitride is first deposited conformally in the metallization pattern 520 to prevent copper migration into the surrounding silicon and/or dielectric material. Thereafter, a layer of copper 524 is deposited using either chemical vapor deposition, physical vapor deposition, electroplating, preferably by electroplating, to form the conductive structure. Once the structure has been filled with copper or other metal, the surface is planarized using chemical mechanical polishing and capped with a capping layer 518, preferably comprising silicon nitride and having a thickness of about 1000 Å, as shown in FIG. 8H. Prior to planarizing the surface, the metal may be annealed in a hydrogen atmosphere to recrystallize the copper fill and to remove voids that may have formed in the structure 500. While not shown, a copper seed layer may be deposited prior to the copper layer 524 when the copper layer 524 is deposited by an electroplating process. The dual damascene formation process may then be repeated to deposit further interconnection levels, of which modern microprocessor integrated circuits have 5 or 6 interconnection levels.

EXAMPLES

The following examples demonstrate deposition of a nano-porous silicon oxide based film having dispersed microscopic gas voids. This example is undertaken using a chemical vapor deposition chamber, and in particular, a CENTURA "DLK" system fabricated and sold by Applied Materials, Inc., Santa Clara, Calif.

Silicon Compound Having Silicon Containing and Thermally Labile Imparting Components (Hypothetical)

A nano-porous silicon oxide based film is deposited at a chamber pressure of 1.0 Torr and temperature of 30° C. from reactive gases which are vaporized and flown into the reactor as follows:

| | |
|---|---|
| methylsilyl-2-furyl ether, at | 150 sccm |
| nitrous oxide (N$_2$O), at | 1000 sccm |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

Mixture of Silicon Containing Compound and Added Thermally Labile Imparting Compound (Hypothetical)

A nano-porous silicon oxide based film is deposited at a chamber pressure of 1.0 Torr and temperature of 30° C. from reactive gases which are vaporized and flown into the reactor as follows:

| | |
|---|---|
| cyclo-1,3,5,7-tetrasilylene-2,6-dioxy-4,8 dimethylene, at | 100 sccm |
| vinyl-2-furyl ether, at | 50 sccm |
| Nitrous Oxide (N$_2$O), at | 1000 sccm |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

Silicon Compound Having Silicon Containing and Thermally Labile Imparting Components and Added Silicon Containing Compound (Hypothetical)

A nano-porous silicon oxide based film is deposited at a chamber pressure of 1.0 Torr and temperature of 0° C. from reactive gases which are vaporized and flown into the reactor as follows:

| | |
|---|---|
| methylsilyl-2-furyl ether, at | 100 sccm |
| cyclo-1,3,5,7-tetrasilylene-2,6-dioxy-4,8 dimethylene, at | 50 sccm |
| Nitrous Oxide (N$_2$O), at | 1000 sccm. |

Prior to entering the chamber, the nitrous oxide is dissociated in a microwave applicator that provides 2000 W of microwave energy. The substrate is positioned 600 mil from the gas distribution showerhead and the reactive gases are introduced for 2 minutes. The substrate is then heated over a time period of 5 minutes, raising the temperature of the substrate by 50° C./min to a temperature of 400° C. to cure and anneal the nano-porous silicon oxide based film.

While the above is a complete description of specific embodiments of the present invention, various modifications, variations, and alternatives may be employed. These equivalents and alternatives are included within the scope of the present invention. Therefore, the scope of this invention is not limited to the embodiments described, but is defined by the following claims and their full scope of equivalents.

What is claimed is:

1. A method of depositing a carbon-doped silicon oxide film on a wafer, the method comprising:
   mixing a silicon containing precursor with a carbon containing precursor in the presence of a plasma to deposit a carbon doped silicon oxide film having a stress of about 20 MPa or less;
   wherein as deposited, the carbon-doped silicon oxide film comprises a porogen, the method further comprising:

annealing the as-deposited carbon doped silicon oxide film to liberate the porogen.

2. The method of claim 1 wherein the porogen comprises a linear organic molecule.

3. The method of claim 1 wherein the porogen comprises a cyclic organic molecule.

4. The method of claim 1 wherein the annealing comprises applying thermal energy to the as-deposited carbon doped silicon oxide film.

5. The method of claim 1 wherein the mixing occurs at a temperature of less than 300° C.

6. The method of claim 1 wherein the annealing comprises applying an electron beam cure step to the as-deposited carbon doped silicon oxide film.

7. The method of claim 6 wherein the carbon doped silicon oxide film exhibits a dielectric constant of 3.0 or less following the electron beam cure step.

* * * * *